US008609256B2

United States Patent
Nair et al.

(10) Patent No.: US 8,609,256 B2
(45) Date of Patent: Dec. 17, 2013

(54) NICKEL-GOLD PLATEABLE THICK FILM SILVER PASTE

(75) Inventors: Kumaran Manikantan Nair, Head of the Harbor, NY (US); Michael A. Skurski, Cary, NC (US); John D. Voultos, Raleigh, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 72 days.

(21) Appl. No.: 12/571,665

(22) Filed: Oct. 1, 2009

(65) Prior Publication Data

US 2010/0086807 A1 Apr. 8, 2010

Related U.S. Application Data

(60) Provisional application No. 61/102,083, filed on Oct. 2, 2008.

(51) Int. Cl.
*B32B 15/00* (2006.01)
*B32B 15/04* (2006.01)
*B32B 15/08* (2006.01)

(52) U.S. Cl.
USPC ................ 428/673; 428/633; 428/546

(58) Field of Classification Search
USPC ......... 428/673, 546, 577, 621, 622, 624, 626, 428/630, 632, 633, 639, 640
See application file for complete search history.

(56) References Cited

U.S. PATENT DOCUMENTS

| 4,536,535 A | 8/1985 | Usala |
| 6,147,019 A | 11/2000 | Donohue |
| 6,156,218 A | 12/2000 | Okubo et al. |
| 6,210,805 B1 * | 4/2001 | Sunahara ............... 428/434 |
| 6,362,089 B1 | 3/2002 | Molla et al. |
| 6,548,327 B2 | 4/2003 | De Pauw et al. |
| 2003/0228968 A1 | 12/2003 | Usui et al. |
| 2005/0003677 A1 | 1/2005 | Dean et al. |
| 2006/0231801 A1 | 10/2006 | Carroll et al. |
| 2007/0023388 A1 * | 2/2007 | Nair et al. ............... 216/13 |

FOREIGN PATENT DOCUMENTS

DE 10 2005 061799 A1 7/2007

OTHER PUBLICATIONS

PCT International Search Report, Jun. 14, 2010.
Gudeczaukas, "Electoless Metal Deposition Process Have Been Developed for LTCC Metallization that Yield Excellent Wire Bond Strengths and Solder Joint Reliability", Uyemura International Corporation.
Gudeczaukas, Don, Electroless Metal Deposition Process Have Been Developed for LTCC Metallization that Yield Excellent Wire Bond Strengths and Solder Joint Reliability, Dec. 1, 2007.
Mallory, Glenn O., Electroless Plating-Fundamentals & Applications, The Fundamental Aspects of Electroless Nickel Plating, Chapter 1, 1990, William Andrew Publishing/Noyes.
Charles Harper, Handbook of Materials Processes for Electronics, 1970, Chapter 12, McGraw-Hill, New York.

* cited by examiner

*Primary Examiner* — Michael La Villa

(57) ABSTRACT

Described are LTCC devices, with external silver containing electrical contacts, that are sequentially plated with a nickel containing metal and a gold containing metal, with a defined silver paste composition for manufacture.

1 Claim, No Drawings

NICKEL-GOLD PLATEABLE THICK FILM SILVER PASTE

CROSS REFERENCE TO RELATED APPLICATIONS

This application claims priority under 35 U.S.C. 119(e) to the following U.S. Provisional Application No. 61/102,083, filed Oct. 2, 2008.

FIELD OF THE INVENTION

The invention relates to silver paste and nickel-gold plating conditions for plating surfaces with silver conductors, suitable for application to the manufacture of multilayer LTCC circuits. The silver composition exhibits process and materials compatibility with nickel-gold plating conditions and highly corrosion-resistant, gold-wire-bondable electronic circuits when used to build high density LTCC devices. The LTCC interconnect circuits are cost-effective to replace gold metal-based LTCC systems, highly reliable and characterized as having low dielectric loss over wide-range of frequencies up to 90 GHz or higher; it also excels in chemical durability, hermeticity, mechanical strength, processing latitude for surface gold wire-bondable.

TECHNICAL BACKGROUND

An interconnect circuit board is a physical realization of electronic circuits or subsystems made from a number of extremely small circuit elements that are electrically and mechanically interconnected. It is frequently desirable to combine these diverse type electronic components in an arrangement so that they can be physically isolated and mounted adjacent to one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways, called vias, through a dielectric layer. Such a multilayer structure allows a circuit to be more compact.

Typically, a LTCC tape is formed by casting a slurry of inorganic solids, organic solids and a fugitive solvent on a removable polymeric film. The slurry consists of glass powder(s) and ceramic oxide filler materials and an organic based resin-solvent system (medium) formulated and processed to a fluid containing dispersed, suspended solids. The tape is made by coating the surface of a removable polymeric film with the slurry so as to form a uniform thickness and width of coating.

To interconnect the electronic functions, precious metal-based thick film pastes printed over the tapes, conductor lines are connected with via-fill conductors, laminated and fired at appropriate temperature to obtain an electronic device. Circuits with silver-based conductors are cost-effective compared to gold-based circuits but they are less reliable particularly if they are exposed to atmospheric humidity.

During the exposure to atmospheric conditions, surface silver conductor will tarnish (oxidation of silver is common phenomenon during the exposure to atmospheric conditions) and circuit functions will fail. To minimize such oxidation phenomenon, coating of surface silver conductor with nickel-gold is a common practice. However base nickel plating which is necessary before plating of gold, generally "lifts" the silver conductors from the LTCC unlike other substrates such as alumina, printed wiring board and copper etc. Such silver conductor pad lifts, no matter how small degree, will degrade the final functional properties such as wire-bonding strength, long term reliability etc of the finished LTCC circuits. In order to minimize bond lifts, plating conditions, physical properties of the plated devices should select in such way to give good wire-bonding conditions and reliability. The major plating conditions that need to be adjusted are: pH and temperature of the plating bath appropriate to the composition of the LTCC and silver conductor; plating thickness of nickel and gold; and the ratio of nickel to gold thickness; Pd-base plating over silver, if needed etc. Several open literature on electroless plating are available, but none are specific to particular chemistry of the LTCC which is one on the most important parameter to determine the appropriate plating conditions and thickness of nickel to gold. ("ElectrolessPlating-Fundamentals & Applications" 1990, edited by G. O. Mallory & J. B. Hajdu, Williams Andrew Publishing/Noyes, Chapter 1, The Fundamental Aspects of Electroless Nickel Planting by Glenn O. Mallory.) D. Gudeczaukas, Uyemura International corporation, Southington CT published several publication on electroless gold plating techniques, particularly one on LTCC in Ceramic Industry, December 2007, p. 13. Several patents describe nickel-gold plating conditions and applications: for example U.S. Pat. Nos. 6,156,218 and 6,362,089 on copper substrates; U.S. Pat. No. 6,548,327 on aluminum etc. The general techniques described in the literature and industry-wide accepted methods are electroless plating of nickel-gold or nickel-palladium-gold under acidic solution pHs at 77-90° C. The LTCC circuits based on Dupont Green tape systems that are described US 2007/011187 will not plate wire-bondable gold under the industry wide accepted plating conditions due to the conductor-substrate bonding failure of the plated parts, irrespective of variation in silver conductor composition. Furthermore, no other LTCC circuits plated with nickel-gold and wire-bondable with long-term adhesion/reliability are presently available in the market place.

The present invention overcomes problems associated with prior art thick film plateable silver conductor compositions for use in LTCC-based nickel-gold plated electronic devices and applications. In particular, the present invention provides thick film compositions and plating conditions required to obtain wire-bondable LTCC structures, which provide superior long-term reliability.

SUMMARY OF THE INVENTION

Described herein is a plating process to plate metal onto an LTCC device comprising the sequential steps of:
a. electrolessly plating at a pH range 4 to 12 a nickel containing metal onto silver containing metal external electrical contacts of an LTCC device; and
b. plating a gold containing metal onto the nickel containing metal wherein said plating is selected from the group consisting of electrolessly plating and immersion plating.

Further disclosed herein is a silver paste composition consisting essentially of, (1) based on weight percent, 75-90% silver powder of different sizes and shapes and the balance organic medium (2) silver in (1) with 0.5-4% high refractory glasses and the balance organic medium.

The glass in the composition described above is a alumino-borosilicate glass as "network formers" with Zn, Ba, Mg, Sr, Sn, Ti. Na ions are as "net-work modifying cations".

A specific glass composition in the above described composition comprises 20.2% $SiO_2$; 2.8% $Al_2O_3$; 20.4 $B_2O_3$; 10.1 ZnO; 19.0% BaO; 3.1% MgO; 3.3% $Na_2O$; 13.7% SrO; 5.5% $TiO_2$; 1.9% $SnO_2$.

The plating conditions of nickel-gold on the surface of silver conductors are specified as as 20-100 preferably 20-60 microinches of gold over 100-300 preferably 100-150 microinches of nickel plated in a pH of between 4-12.

In the case of immersion/flash gold plating conditions, the pH of the plating could be more acidic up to a pH of 3 and thickness of gold could be approximately as low as to 4 micro-inches.

Furthermore successful plating of gold over the via-fill conductors is also demonstrated with long term reliability.

The present invention provides an improved alternative to prior art thick film compositions for use in high reliability microwave applications with reduced cost by replacing mixed metal (silver-palladium-platinum-gold) compositions or complete gold compositions by plateable silver compositions.

DETAILED DESCRIPTION OF THE INVENTION

1. Tape Casting Chemistry, Tape Casting & LTCC Processing

Typically, a LTCC tape is formed by casting a slurry of inorganic solids, organic solids and a fugitive solvent on a removable polymeric film. The slurry consists of glass powder(s) and ceramic oxide filler materials and an organic based resin-solvent system (medium) formulated and processed to a fluid containing dispersed, suspended solids. The tape is made by coating the surface of a removable polymeric film with the slurry, so as to form a uniform thickness and width of coating.

Such tapes are commercially available as Dupont 951 and 943 Green tapes. Glass chemical compositions are also discussed in U.S. Pat. No. 6,147,019 and US 2007/011187. Generally ceramic fillers will react with glass compositions and new crystalline phase will form. The stability of these phases in the nickel-gold plating baths is pertinent to the present invention. Ceramic fillers will play an important role in forming leachable phases in acidic/basic pHs.

Refractory ceramic fillers, such as $Al_2O_3$, $ZrO_2$, $SiO_2$, $TiO_2$ or mixtures thereof, may be added to the castable dielectric composition in an amount of 0-50 wt. % based on solids. Depending on the type of filler, different crystalline phases are expected to form after firing. The filler can control the leaching of the fired tape components into the plating bath. For example phases containing Mg, Zn could leach into the bath, on the other hand Alumina based crystalline phases are relatively stable.

$Al_2O_3$ is the preferred ceramic filler since it reacts with the glass to form an Al-containing crystalline phases. $Al_2O_3$ is very effective in providing high mechanical strength and inertness against detrimental chemical reactions. Another function of the ceramic filler is rheological control of the entire system during firing. The ceramic particles limit flow of the glass by acting as a physical barrier. They also inhibit sintering of the glass and thus facilitate better burnout of the organics. Other fillers such as quartz, $CaZrO_3$, mullite, cordierite, forsterite, zircon, zirconia, $BaTiO_3$, $CaTiO_3$, $MgTiO_3$, amorphous silica and the like or mixtures thereof may be used to modify tape performance and characteristics. The amount of filler, type of filler and physical characteristics of the filler will influence the shrinkage of the fired green tape. Tape shrinkage maybe adjusted to controlled levels by the use of a multi-modal particle size distribution optimized to reduce shrinkage by increasing filler packing density.

For the purpose of obtaining higher densification of the composition upon firing, it is important that the inorganic solids have small particle sizes. In particular, substantially all of the particles, for example 90% or 95%, should not exceed 15 microns or even 10 microns. Subject to these maximum size limitations, in some embodiments at least 50% of the particles, both glass and ceramic filler, are greater than 1 micron and less than 6 microns.

The organic medium in which the glass and ceramic inorganic solids are dispersed is comprised of a polymeric binder which is dissolved in a volatile organic solvent, and, optionally, other dissolved materials such as plasticizers, release agents, dispersing agents, stripping agents, antifoaming agents, stabilizing agents and wetting agents.

To obtain better binding efficiency, it is preferred to use at least 5% wt. polymer binder for 90% wt. solids, which includes glass and ceramic filler, based on total composition. However, it is more preferred to use no more than 30% wt. polymer binder and other low volatility modifiers such as plasticizer and a minimum of 70% inorganic solids. Within these limits, it is desirable to use the least possible amount of binder and other low volatility organic modifiers, in order to reduce the amount of organics which must be removed by pyrolysis, and to obtain better particle packing which facilitates full densification upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials U.S. Pat. No. 4,536,535 to Usala, issued Aug. 20, 1985, has disclosed an organic binder which is a mixture of compatible multipolymers of 0-100% wt. $C_{1-8}$ alkyl methacrylate, 100-0% wt. $C_{1-8}$ alkyl acrylate and 0-5% wt. ethylenically unsaturated carboxylic acid or amine. Because the above polymers can be used in minimum quantity with a maximum quantity of dielectric solids, they are preferably selected to produce the dielectric compositions of this invention. For this reason, the disclosure of the above-referred Usala application is incorporated by reference herein.

Frequently, the polymeric binder will also contain a small amount, relative to the binder polymer, of a plasticizer that serves to lower the glass transition temperature (Tg) of the binder polymer. The choice of plasticizers, of course, is determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate 1,1,1-trichloroethane, tetrachloroethylene, amyl acetate, 2,2,4-triethyl pentanediol-1, 3-monoisobutyrate, toluene, methylene chloride and fluorocarbons. Individual solvents mentioned above may not completely dissolve the binder polymers. Yet, when blended with other solvent(s), they function satisfactorily. This is well within the skill of those in the art. A particularly preferred solvent is ethyl acetate since it avoids the use of environmentally hazardous chlorocarbons.

In addition to the solvent and polymer, a plasticizer is used to prevent tape cracking and provide wider latitude of as-coated tape handling ability such as blanking, printing, and lamination. A preferred plasticizer is BENZOFLEX® 400, trademark of Velsicol Chemical Corp., which is a polypropylene glycol dibenzoate.

A green tape is formed by casting a thin layer of a slurry dispersion of the glass, ceramic filler, polymeric binder and solvent(s) as described above onto a flexible substrate, heating the cast layer to remove the volatile solvent. It is preferred that the primary tape not exceed 20 mils in thickness and preferably 1 to 10 mils. It is preferred that the constraining tape be 1 to 10 mils and preferably 1 to 3 mils in thickness. The tape is then blanked into sheets or collected in a roll form. The green tape is typically used as a dielectric or insulating material for multilayer electronic circuits. A sheet of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize and form via holes in the green tape. Typical via hole sizes range from 0.004 inch to 0.25 inch. The interconnections between layers are formed by filling the via holes with a thick film conductive ink. This ink is usually applied by standard screen printing techniques. Each layer of circuitry is completed by screen printing conductor tracks. Also, resistor inks or high dielectric constant inks can be printed on selected layer(s) to form resistive or capacitive circuit elements. Furthermore, specially formulated high dielectric constant green tapes similar to those used in the multilayer capacitor industry can be incorporated as part of the multilayer circuitry.

After each layer of the circuit is completed, the individual layers are collated and laminated. A confined uniaxial or isostatic pressing die is used to insure precise alignment between layers. The laminate assemblies are trimmed with a hot stage cutter. Firing is typically carried out in a standard thick film conveyor belt furnace or in a box furnace with a programmed heating cycle. This method will also allow top and/or bottom conductors to be co-fired as part of the constrained sintered structure without the need for using a conventional release tape as the top and bottom layer, and the removal and cleaning of the release tape after firing.

The plating properties of the fired tape (or film) of the present invention depend on the quantity and/or quality of total crystals and glasses present and the leaching characteristics of the components present in the tape. The low temperature co-fired ceramic (LTCC) device functional properties also depend on the conductor used. The interaction of conductor with the dielectric tape may, in some embodiments, alter the chemistry of the dielectric portion of the device thus changing the bonding between the conductor and substrate. By adjusting the heating profile and/or changing the quality and/or quantity of the filler in the tape and/or chemistry of the conductor, one skilled in the art could accomplish varying conductor-ceramic bond strength, leaching characteristics, plating quality of the surface conductor.

As used herein, the term "firing" means heating the assembly in an oxidizing atmosphere such as air to a temperature, and for a time sufficient to volatilize (burn-out) all of the organic material in the layers of the assemblage to sinter any glass, metal or dielectric material in the layers and thus densify the entire assembly.

It will be recognized by those skilled in the art that in each of the laminating steps the layers must be accurate in registration so that the vias are properly connected to the appropriate conductive path of the adjacent functional layer.

The term "functional layer" refers to the printed green tape, which has conductive, resistive or capacitive functionality. Thus, as indicated above, a typical green tape layer may have printed thereon one or more resistor circuits and/or capacitors as well as conductive circuits.

It should also be recognized that multilayer laminates having greater than 10 layers typically require that the firing cycle may exceed 20 hours to provide adequate time for organic thermal decomposition.

The use of the composition(s) of the present invention may be used in the formation of electronic articles including multilayer circuits in general, and to form microwave and other high frequency circuit components including but not limited to: high frequency sensors, multi-mode radar modules, telecommunications components and modules, and antennas in particular.

These multilayer circuits require that the circuit be constructed of several layers of conductors separated by insulating dielectric layers. The insulating dielectric layer may be made up of one or more layers of the tape of the present invention. The conductive layers are interconnected between levels by electrically conductive pathways through a dielectric layer. Upon firing, the multilayer structure, made-up of dielectric and conductive layers, a composite is formed which allows for a functioning circuit (i.e. an electrically functional composite structure is formed). The composite as defined herein is a structural material composed of distinct parts resulting from the firing of the multilayer structure which results in an electrically functioning circuit.

LTCC Chemical Durability Test;

Ten layers of tape samples were laminated and fired at standard LTCC heating profile and dipped in two different mineral acids of 10% acid strength kept at constant temperature of 40° C., for a constant period of time of 30 minutes each respectively. The weight loss (difference in % of weight) due to leaching of tape components into acid were taken as the measure of chemical durability. Four commercially available LTCC tapes, 951-AT and 943-A5, (three from Dupont Company, Wilmington Del.) and an experimental tape were used to evaluate the leaching of the components in the acidic pH. Results are given below:

TABLE 1

Acid Leach-ability of Several LTCC

| Sample | % Weight Loss | |
|---|---|---|
| | HCL | H2SO4 |
| 9K7-PX (Low-loss LTCC) | 0.10 | 0.11 |
| 943-A5 (Low loss LTCC) | 0.42 | 0.23 |
| 951-AT (Standard LTCC) | 0.01 | 0.01 |
| SMI-ED (A commercial Tape) | 0.59 | 1.23 |
| KH30 (An experimental tape) | 0.53 | 0.32 |

The above table demonstrates the variation of leaching of phases/ions from the tape in acidic medium. Such leaching of phases from the LTCC device during the nickel-gold plating will "lift" the silver conductor, or in other words, weakens the bonding between the conductor and the substrate LTCC thus degrading the long-term reliability of the circuits. Most nickel-gold plating on silver terminations are preformed in acidic or close to neutral pH plating bath. The plating of the present invention is done at basic pH to minimize leaching which is not only related to pH but the glass chemistry, filler chemistry, reaction between the filler to the glass and the nature of the resultant crystal species.

Thick Film Silver Composition

Metal Powders:

The finely divided metals used in the invention can be silver metal powders which are commercially available for the thick film conductors or organic-coated noble metal powder for better dispersion. The particle size of the above-described metallic materials is not narrowly critical from the standpoint of their technical effectiveness in the invention. However, they should, of course, be of a size appropriate to the manner in which they are applied, which is usually screen-printing and/or stencil-applying, and to the firing conditions. Furthermore, particle size and morphology of the above-mentioned metal powders should be appropriate in screen-printing and/or stencil-applying over non-fired ceramic tape of thickness between 2 mil to 10 mil or higher and to the laminating conditions of the composite and to the firing conditions, wherein mil is $1/1000^{th}$ inch. Thus the metallic material should be no bigger than 10 micron and preferably should be below about 5 micron. As a practical matter, the available particle size of the metals is as low as from 0.1 to 10 micron.

The silver metal powders can have either flake or nonflake morphology. The nonflake powders can be irregularly shaped or spherical. By flake morphology is meant a metal powder whose predominant shape is flake as determined by scanning electron microscopy. Such flake silvers have an average surface area of approximately 1 $m^2/g$ and solid contents of approximately 99-100% by weight. Nonflake silver powders typically have an average surface area 0.1-2.0 $m^2/g$ and solid contents of approximately 99-100% by weight.

Inorganic Glass Binder

The glass component of the conductor compositions of this invention is a high viscosity glass at 0-10 parts by weight level and preferably, at 0-5 parts level. A typical glass composition described above is an alumino borosilicate glass as "network formers" with Ba, Mg, Zn, Sr. Na, Ti & Sn ions are as "network modifying cations". A specific glass composition described above consists of 20.2% $SiO_2$; 2.8% $Al_2O_3$; 20.4 $B_2O_3$; 10.1 ZnO; 19.0% BaO; 3.1 MgO; 3.3% $Na_2O$; 13.7% SrO; 5.5% $TiO_2$; 1.9% $SnO_2$. Variation in the glass chemistry is within the scope of this invention, as long as the viscosity of glass will not allow glass deposition over the fired silver conductor. Glass addition to the composition is optional depending on the specific fired conductor property requirements.

The major functions of the glass frits are: it aids the sintering of the inorganic crystalline particulate matter and minimizes the intermixing of conductor materials with remanant glasses present in the LTCC ceramics and minimizes deposition of glass film on surfaces of the conductor which may prevent plating of the surface. Addition of glass binder to the composition depends on the chemistry of the substrate tape and its interaction to the conductor.

Organic Medium

The inorganic particles are mixed with an inert liquid medium (vehicle) by mechanical mixing (e.g. on a roll mill) to form a paste-like composition having suitable consistency and rheology for screen printing and/or stencil applying. The latter is printed as a "thick film" on LTCC green tapes in the conventional manner. Any inert liquid may be used as the vehicle. Various organic liquids, with or without the thickening and/or stabilizing agents and/or other common additives may be used as the vehicle. The only specific criteria of the vehicle are that it must be chemically compatible to the organics present in the LTCC green tapes. Exemplary organic liquids which can be used are the aliphatic alcohols, esters of such alcohols, for example, acetates and propionates, terpenes such as pine oil, terpinol and the like, texanol and the like, solutions of resins such as ethyl cellulose in solvents as pine oil, and the monobutyl ether of ethylene glycol monoacetate. The vehicle may contain volatile liquids to promote fast setting after application to the tape.

In one embodiment of the present invention, the resin used has ethyl cellulose structure with ethoxl content of 45.0-51.5% and preferably ethoxyl content of 48.0-49.5% (N-type) and degree of substitution of ethoxyl groups per anhydroglucose unit of 2.22 to 2.73 and preferably 2.46-2.58 (N-type) as described in "Aqualon ethyl cellulose" booklet and supplied by Hercules Incorporated, Wilmington Del. This booklet also describes a typical structure of ethyl cellulose with complete (54.88%) ethoxyl substitution 1 along with the structural formula of cellulose molecule. In one embodiment of the invention the solvent vehicle is texanol, with chemical composition 2,2,4-Trimethyl-1,3-pentanediol monoisobutyrate; Propionic acid, 2-methyl-, monoester with 2,2,4-trimethyl-1,3-pentanediol; Isobutyric acid ester with 2,2,4-trimethyl-1,3-pentanediol (composition as listed in the "International Labor Organization", ICSC:0629 November 2003). The viscosity of the medium (resin dissolved in organic vehicle solvent) of the invention as measured using RVT No 5 @ 10 RPM is 5.0-15.0 PaS, or 7.5 to 10.5 PaS. Another solvent that could be used is 3-cyclohexane-1-methanol, alpha, alpha, 4-trimethyl-terpene alcohol described in JT Baker Inc, Phillipsburg, N.J.

The ratio of vehicle to solids in the dispersions can vary considerably and depends upon the manner in which the dispersion is to be applied. Normally to achieve good coverage the dispersions will contain complementally, 60-98% solids and 40-2% vehicle. The compositions of the present invention may, of course, be modified by the addition of other materials which do not affect its beneficial characteristics. Such modification is well within the skill of the art.

Thick film techniques are contrasted with thin film techniques which involve deposition of particles by evaporation or sputtering with or without vacuum. Thick film techniques are discussed in Handbook of Materials and Processes for Electronics, C. A. Harper, Editor, McGraw-Hill, NY., 1970, Chapter 12.

Thick film Formulation and Application

The thick film composition consists of:
(a) 70-90% by weight finely divided particles of silver metal powders, coated noble metal powders or combinations of thereof,
(b) Optionally 0-5% by weight finely divided particles of refractory glasses with high viscosity at the maximum firing temperature,
(c) Optionally, 0.1-5% by weight inorganic metal oxides and/or inorganic compounds/or organometallics capable of controlling the densification, sintering and grain growth of the conductor composites,
(d) 2-20% of organic medium consisting of ethyl cellulose with, for example, ethoyxl content of 45.0-51.5% or 48.0-49.5%, and degree of substitution of ethoxyl groups per anhydroglucose unit of, for example, 2.22-2.73 or 2.46-2.58 and, optionally, other organic vehicle materials.

In the preparation of the compositions of the present invention particulate inorganic solids are mixed with the organic carrier and dispersed with suitable equipment, such as a three-roll mill, to form a suspension, resulting in a composition for which the viscosity will be in the range of 150-250 pascal-seconds at a shear rate of 4 sec-1.

In the examples which follow, the formulation was carried out in the following manner: The ingredients of the paste are weighed together in a container. The components are then vigorously mixed to form a uniform blend; then the blend is passed through dispersing equipment such as a three roll mill, to achieve a good dispersion of particles. A Hegman gauge is used to determine the state of dispersion of the particles in the paste. This instrument consists of a channel in a block of steel that is 25 micron deep (1 mil) on one end and ramps up to zero depth at the other end. A blade is used to draw down paste along the length of the channel. Scratches will appear in the channel where agglomerates' diameter is greater than the channel depth. One example of a satisfactory dispersion gives a fourth scratch point of 10-18 micron typically. Fourth scratch measurements of >20 micron and half channel measurements of >10 micron indicate a poorly dispersed suspension/paste. The composition may then be screened using for example a 500 mesh screen to remove larger particles, if any.

The composition is then applied to a substrate. For example, details of "green tape" application are described below. A "green tape" is formed by casting a 1-20 mil, preferably 2-10 mil, thin layer of a slurry dispersion of the glass and ceramic filler fine particulates, polymeric binder(s) and solvent(s) as described in the art of "tape casting" into a flexible substrate, heating the cast layer to remove the volatile solvent. The tape is blanked into sheets or in the roll form. This green tape is used as an insulating substrate for multilayer electronic circuits/devices, in place of conventional substrates such as alumina and other refractory ceramic substrates. The green tape sheet is blanked with registration holes at the four corners; and via holes to connect the different layers of conductors using mechanical punching. The size of via holes varies depending on circuit design and property requirements. The interconnections of circuit between conductor track layers of the tape are perform by screen printing the conductive inks in the via holes.

The conductive line compositions of the invention is applied to a sheet of green tape, usually by the process of screen printing, to a wet thickness of about 10-30 micron and preferably 15-20 micron for conductor lines and the via holes are filled with the same ink at the same time.

After each layer of tape is printed with conductor lines and via holes as appropriate to the circuit design, the individual layers are collated, laminated and pressed using uniaxial or isostatic pressing die and techniques as described elsewhere in the art of tape pressing/lamination techniques. It will be recognized by those skilled in the art that in each of the laminating steps the printed tape layers must be accurate in registration so that the vias are properly connected to the appropriate conductive lines of the adjacent functional layer, and in the case of thermal vias, each via will be connected appropriately to the next one.

Firing to effect sintering of the green tape compositions and of the inorganic binder as well as the finely divided particles of metal, is typically done in a well ventilated belt conveyor furnace or programmed box furnace with a temperature profile that will allow de-polymerization of polymers; and/or burnout of the organic matter at about 300-600° C., a period of maximum temperature of about 800-950° C., lasting about 5-20 minutes, followed by a controlled cool down cycle to prevent over-sintering and crystal growth, unwanted chemical reactions at intermediate temperatures, or substrate/fired ceramic tape fracture from too rapid cool down. The overall firing procedure will preferably extend over a period of between 3.5 to 5 hours, and in certain cases it could take up to 24 hours or more depending on the number of layers of green tapes laminated together and/or the thickness of the green tape layers.

The fired thickness of the conductor can range from about 5 to about 15 micron, depending on the percent of solids, the type of screen the composition is printed with, the printer set up, and degree of sintering of the inorganic solids. The thickness of via conductors vary depending on the thickness of the green tape used and degree of sintering of the via composition. In order to avoid two major defects, dimpling and posting of the vias, the selection of viscosity and solid content of the composition is important. In general, increased solid content could result in posting and lower solid content will result in dimpling.

The conductor compositions of this invention can be printed as film onto the green tapes or ceramic substrates, or onto other thick films either by using an automated printer or a hand printer in the conventional manner.

2. Electro-Less Plating to LTCC

Electro-less plating has advantages over electrolytic plating with LTCC materials because it allows circuits to be designed without requiring electrical connection to be applied to every plated surface. This gives the circuit designer flexibility for greater consideration of circuit size, performance and fabrication efficiencies.

Electroless nickel and gold plating of LTCC silver circuits is accomplished by a sequence that includes metals deposition from a variety of mechanisms including adsorption, immersion and autocatalytic plating. Electroless nickel is a well known and widely used autocatalytic plating process. The nickel metal deposited acts as the catalyst for continuing the reaction resulting in the reduction of nickel ions from solution to nickel metal on the surface. In this way, nickel continues to build thickness at a predictable rate.

During the electroless nickel plating reaction, phosphorus from the reducing agent sodium hypophosphite is also deposited with nickel, resulting in 6-8 weight % in the deposit. This is in the range of mid-phosphorus and is recommended for LTCC nickel-gold electro-less plating applications. Electroless nickel thicknesses for LTCC should be from 100 to 200 micro-inches. Excessive nickel thickness can affect brazing and other processing later on. If thickness is too thin, it may affect plated porosity and thereby impact the plated gold deposit.

Silver metal itself, does not work as a catalyst for the reaction of electro-less nickel plating. To plate electro-less nickel onto silver patterns, they must first be activated. Activation is accomplished by depositing a catalytic metal onto the silver surfaces. Typically, this is done using an activator solution such as palladium chloride in dilute HCl. This activator will deposit palladium on the silver using an adsorption mechanism.

Palladium is an excellent catalyst for electro-less nickel plating. Palladium is not evenly deposited as a continuous film, but as scattered sites across the surface. Once the electroless plating reaction is initialized, the reaction sets up a small voltage over the silver surface and the electroless nickel quickly deposits as a continuous layer. The function of palladium is only to 'kick-off' the plating reaction. The palladium has very little to do with adhesion of the electroless nickel to the silver. The nickel does plate directly to the silver surface.

Electroless gold is also an autocatalytic plating process, working in the same manner as described above for electroless nickel with one exception. There is not a co-deposit of any materials from the reducing agent. Gold is deposited at a high purity (99.9+%) so that it works very well in semiconductor packaging applications requiring wire bonding and soldering. Typical thickness requirements range from 20 to 150 microinches (μinch).

Unfortunately, electroless gold plating reactions are not catalyzed by nickel so an intermediate layer of gold needs to be plated over the electroless nickel by using an immersion gold plating bath, working by way of a metal displacement reaction. This is different from an activator bath however, since the immersion gold deposit does completely cover the electroless nickel surfaces and the immersion gold deposit does provide adhesion to the nickel and to the electroless gold deposit. A primary reason for coating all nickel surfaces in this step is to protect the electroless gold plating bath. Electroless gold plating baths are intolerant to nickel contamination. Immersion gold plating deposits are typically 4-8 microinches in thickness and do completely seal the nickel surfaces. Immersion gold also protects and seals all the nickel surfaces, and decreases the rate of oxidation and extends the shelf life of plated parts.

Illustration given below shows the typical process flow for plating to silver on LTCC used in this invention. The cleaning step removes contaminants (fingerprints, oil, wax, dirt etc.) from the base metal [3] while etching is done to remove oxides from the surface of the base metal, providing a better surface for activation and good adhesion of the plated deposit.

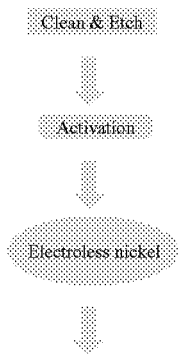

-continued

Plating Experiments:

Many different plating solutions are used by commercially. The invention plates LTCC substrates with two common metal systems: (1) nickel-gold and (2) nickel-palladium-gold. In the case of silver conductors, a neutral pH palladium catalyst solution is used to minimize the silver conductor "lift" from the substrates. Details of plating fundamentals and applications are described in "Electroless Plating-Fundamentals & Applications" 1990, edited by G. O. Mallory & J. B. Hajdu, Williams Andrew Publishing/Noyes. Uyemura International Corporation, 240 Town Line Road, Southington, Conn., a major world-wide supplier of plating solutions, published several technical data sheets and articles on the chemistry, plating techniques & plating conditions most notably one "Electroless plating for LTCC Metallization". They recommend to plate silver conductors over LTCC substrates at or near neutral pH and the bath solution temperature of 77-90° C. for best performance in bonding of the plated parts. The required thickness of plated nickel at up to 300 micro-inches followed by gold or palladium plus gold as required.

Both thick electroless gold and a few atoms of immersion gold plating over the nickel is the recommended process by the plating solution manufacturers.

Two different commercially available plating houses: one for plating flash gold or immersion gold (very thin gold with thickness ranging approximately 4-8 micro-inches) and other for electro-less gold (gold thickness varying 20-150 microinches) are used to plate DUPONT 951 Green-tape based LTCC devices using the recommended plating conditions of pH, thickness and temperature. The immersion plated parts are evaluated for adhesion using 62/36/2 (Pb/Sn/Ag) solder in the case of immersion gold and 1 & 2 mil gold wire bonding and gold-tin brazing in the case of electro-less gold. The soldered parts are tested for the wire-bonding strength using Instron equipment. The electro-less plated gold parts are evaluated for (1) gold wirebonding and reliability (2) Gold-tin (80/20) brazing and reliability and (3) wire-peel 62/36/2 (Pb/Sn/Ag) solder adhesion and reliability Plating Comparative Example LTCC assemblies was prepared using DUPONT 951 Green-tape with external metal contacts of each of silver formulations 1, 2 and 3 then fired. The fired assemblies were electolessly plated with nickel according to the conditions of Uyemura at approximately close to neutral pH and a temperature of 77-90° C. to deposit approximately 300 microinches of nickel onto the metal contacts. Some fired assemblies were further electrolessly plated with approximately 20-150 microinches of gold according to the conditions of Uyemura, and some were immersion plated with gold. The plating conditions such as pH of the invention vary from that of Uyemura.

EXAMPLES

Silver Compositions
Three typical silver formulations are listed (wt %):

TABLE 2

Silver Formulations

| Formulation | #1 | #2 | #3 |
|---|---|---|---|
| Silver powder #1 | 45.4 | 0.0 | 85.0 |
| Silver powder #2 | 33.2 | 0.0 | 0.0 |
| Silver Powder #3 | 0.0 | 30.0 | 0.0 |
| Silver powder #4 | 0.0 | 40.0 | 0.0 |
| Frit powder | 1.2 | 2.2 | 0.0 |
| Organics | Balance | Balance | Balance |

Plating Example 1

Immersion Gold Plating

LTCC assemblies were prepared using DUPONT 951 Green-tape with external metal contacts of each of silver formulations 1, 2 and 3 then fired. The fired assemblies were electolessly plated with nickel at a pH between around 4-12 and a temperature of 77-90° C. The assemblies were plated for 10, 20 or 30 minutes to vary the thickness of deposited nickel. The assemblies were then immersion plated to deposit gold. Gold wire of 1 mil diameter was soldered to the plated metal contacts with a solder composed of 62 wt % lead, 36% tin, 2% silver. The table 3 below shows that all samples have satisfactory adhesion.

TABLE 3

Wire peel Adhesion Values of Immersion-Plated Gold

| Silver Composition # | Time of Nickel Plating (min) | Initial Solder Adhesion (N) |
|---|---|---|
| 1 | 30 | 25 |
|   | 20 | 25 |
|   | 10 | 30 |
| 2 | 30 | 22 |
|   | 20 | 24 |
|   | 10 | 22 |
| 3 | 30 | 17 |
|   | 20 | 19 |
|   | 10 | 20 |

Plating Example 2

Electro-Less Gold Plating

LTCC assemblies were prepared using DUPONT 951 Green-tape with external metal contacts of each of silver formulations 1 and 3 then fired. The fired assemblies were electolessly plated with nickel at a pH of between 4-12 and a temperature of 77-90° C. to deposit approximately 160 microinches of nickel. The assemblies were electolessly plated with gold at a pH between 4-12 and a temperature of 77-90° C. to deposit 20 to 150 microinches of gold, preferably evaluated plated gold thicknesses between 30-150 micro inches. Gold wires of 1 or 2 mil diameter were wire-bonded to the plated metal contacts. The results show that all samples have satisfactory adhesion. All parts are tested for gold wire bonding and 80Au/20Sn brazing. Brazing the parts is needed for electronic package assembly.

Gold Wire Bonding on Plated Gold and Long Term Reliability of Electro-Less Plated Gold Standard Palomar 2460-V Bonder, and 99.99% gold wires of thickness 0.001 inch was used to evaluate the bonding. For these wire bonding assessments, 1600 wires were bonded, 30 pulled per grouping. Early in this development program, 2 mil Au wire was tested to help understand adhesion of the silver conductor to the substrate, and adhesion of the gold plating to the conductor. These results were also good; 38.6 grams mean pull strength, with no bond lifts or metal lifts.

Reliability for wire bonding performance was determined by accelerated life testing which included thermal aging at 150° C. to 1000 hours, exposure to environmental conditions of 85% RH and 85° C. for up to 1000 hours, and thermal cycling using a 2 hour −40° C./+125° C. schedule, to 1000 cycles. Multiple sets of test parts using several combinations of paste lots and tape lots were used for the analyses to help insure repeatability.

It is important to note that wire bond data obtained at greater thickness plated electroless gold exhibited periodic bond lifts after minimal thermal aging exposure. So a clear process window of plated gold thickness was established. No bond lifts or metal lifts were observed when plated gold thickness was between 40 to 80 μinches. The typical failure modes were wire breaks or heel breaks at either first or second bonds. Results are given in Table #4 for thicker plated gold and Table #5 for several thinner plated gold over different silver compositions.

TABLE 4

Long Term Gold Wire Bonding Reliability of 150 micro-inches Electro-less Ni/Au Plated Silver Composition
Composition 1

| hrs/cycles | thermal age at 150 C. 150 μinch | Age at 85% RH/85 C. 150 μinch | TCA (−40/+125 C.) 150 μinch |
|---|---|---|---|
| 0 | 12.8 | 12.8 | 12.8 |
| 250 | 12.5 | 12.8 | 12.2 |
| 500 | 12.1 | 12.5 | 12.2 |
| 1000 | 11.8 | 12.4 | 12.1 | values are grams

TABLE 5

Long Term Gold Wire Bonding Reliability of 40, 60 & 80 micro-inches Electro-less Ni/Au Plated Silver Compositions

| hrs/cycles | thermal age at 150 C. | | | Age at 85% RH/85 C. | | | TCA (−40/+125 C.) | | |
|---|---|---|---|---|---|---|---|---|---|
|  | 40 μinch | 60 μinch | 80 μinch | 40 μinch | 60 μinch | 80 μinch | 40 μinch | 60 μinch | 80 μinch |
| Composition 2 | | | | | | | | | |
| 0 | 12.1 | 12.0 | 11.8 | 12.1 | 12.0 | 11.8 | 12.1 | 12.0 | 11.8 |
| 250 | 11.4 | 11.6 | 11.6 | 12.0 | 12.0 | 12.2 | 11.5 | 11.5 | 11.9 |
| 500 | 11.3 | 11.7 | 11.4 | 11.9 | 12.0 | 11.9 | 11.2 | 11.4 | 11.8 |
| 1000 | 11.1 | 11.3 | 11.4 | 11.5 | 11.6 | 11.9 | 11.8 | 11.7 | 11.5 |
| Composition 3 | | | | | | | | | |
| 0 | 11.7 | 11.6 | 11.9 | 11.7 | 11.6 | 11.9 | 11.7 | 11.6 | 11.9 |
| 250 | 11.5 | 11.6 | 11.6 | 12.3 | 11.9 | 11.9 | 11.7 | 12.1 | 11.5 |
| 500 | 11.2 | 11.5 | 11.3 | 12.2 | 12.0 | 11.9 | 11.6 | 11.9 | 11.2 |
| 1000 | 11.1 | 11.1 | 11.2 | 11.7 | 11.5 | 11.7 | 11.4 | 11.1 | 11.6 | values are grams

Gold-Tin Alloy Brazing on Plated Gold and Long Term Reliability of-Electro-Less Plated Gold Performance was determined by a standard pin pull adhesion method using Kovar pins with a pre-form of 80Au/20Sn. The (PGA) pin grid array pattern consists of 0.070" printed pads on 0.100" pitch. The pin or nail head diameter measures 0.025", with a shank diameter of approximately 0.018" and lead length of 0.150". A graphite braze fixture is positioned so that the metallized plated pads are in contact with the nail heads during the brazing profile. The brazing temperature profile in Figure was optimized with peak temperature of 300° C. for 5 minutes. It provides optimum pull strength values for cofired frit-less silver composition on DuPont™ Green Tape™ 951 low temperature co-fired ceramic (LTCC). The pull strength of brazed and long term reliability are shown in Figure. It indicates that plated and brazed parts can achieve pull strength values above 10 pounds after 1000 thermal shock cycles (−40° C./+125° C., 60 minute cycles). Unlike the wire bonding work, brazing was tested using a more severe one hour thermal shock cycle. At the lower plated Au thickness of approximately 40-60 pinch, the mean pull strength was 16.1 pounds after 1000 thermal shock cycles. Thermal aging data at 150° C. indicate strong values regardless of plated Au thicknesses evaluated. The failures, and actual pin breaks may occur when values above 15 pounds are achieved. Failures between nickel and gold, or silver and nickel are much less frequent, but do occur and can range from 3-8 pounds.

Data show in Tables #6 & 7 that thinner plated gold provides slightly higher pull strength values after aging. Typical initial failure modes show pads pulling ceramic out. As aging proceeds, the more prevalent failure mode shows the pad lifting away from the ceramic. The data in table #7 also show that values drop dramatically after 500 thermal cycles in the case of thicker plated gold samples. Similar results are also noticed on plated samples when the silver samples are refired up to six times in 30 minutes belt profile before plating

TABLE 6

Aged Adhesion values* of Gold-Tin Brazed Parts of Electro-less Ni/Au Plated Silver Composition # 3

| Aged at 150 C. | Thickness of Plated Gold (micro inches) | | |
|---|---|---|---|
| (Hrs) | 40 | 60 | 80 |
| Initial | 19.6 | 19.1 | 20.6 |
| 250 | 21.8 | 22.3 | 22.1 |
| 1000 | 21.2 | 16.5 | 17.3 |

*Pounds

TABLE 7

Adhesion values* After Thermal Shock Cycle −40° C./+125° C. of Gold-Tin Brazed Parts of Electro-less Ni/Au Plated Silver Composition # 3

| Thermal Cycles | Thickness of Plated Gold (micro inches) | | |
|---|---|---|---|
| (#) | 40 | 60 | 80 |
| Initial | 19.6 | 19.1 | 20.6 |
| 250 | 19.9 | 19.1 | 20.2 |
| 500 | 20.0 | 13.5 | 12.2 |
| 1000 | 16.0 | 10.8 | 10.4 |

*Pounds

Wire-Peel Test of Dip-Solder Adhesion and Long Term Reliability of-Electro-Less Plated Gold Wire peel adhesion by dip soldering was also evaluated on nickel-gold plated silver sample. This test is based on an ASTM standard method; using 80 mil pads and #20 AWG tinned copper wire. After dip soldering with Sn62/Pb36/Ag2 solder at 220° C., 10 second dips, wires are bent at a 90 degree angle adjacent to the pad, and then pulled using an Instron device. 40 & 60 μinch thickness plated gold was evaluated for several gold thicknesses for all three formulations. The results are shown in Table #8 for all the three silver compositions after aging under 150° C., aged under 85% RH at 85° C. and thermal cycles.

TABLE 8

Aged Adhesion Values of Dip-Soldered Plated Parts After Long Term Reliability Tests

| | aging at 150 C. | | 85% RH/85 C. | | thermal cycles | |
|---|---|---|---|---|---|---|
| hrs. | 40 μin | 60 μin | 40 μin | 60 μin | 40 μin | 60 μin |
| Silver Composition 1 | | | | | | |
| 0 | 17.3 | 20.9 | 17.3 | 20.9 | 17.3 | 20.9 |
| 250 | 5.8 | 12.4 | 17.7 | 23.9 | 5.6 | na |
| 500 | 14.5 | 6.4 | 20.1 | 23.0 | 6.1 | 6.1 |
| 1000 | 9.0 | 0.0 | 18.5 | 23.5 | 4.1 | 6.0 |
| Silver Composition 2 | | | | | | |
| 0 | 15.4 | 13.1 | 15.4 | 13.1 | 15.4 | 13.1 |
| 250 | 5.2 | 12.2 | 8.9 | 13.1 | 4.4 | na |
| 500 | 12.5 | 10.6 | 9.5 | 11.8 | 5.3 | 6.6 |
| 1000 | 8.6 | 11.6 | 11.1 | 13.4 | 3.3 | 6.3 |
| Silver Composition 3 | | | | | | |
| 0 | 23.5 | 13.5 | 23.5 | 13.5 | 23.5 | 13.5 |
| 250 | 12.4 | 14.4 | 18.0 | 16.8 | 3.5 | na |
| 500 | 21.5 | 9.2 | 22.1 | 17.1 | 5.5 | 6.4 |
| 1000 | 17.8 | 10.6 | 19.4 | 16.3 | 4.3 | 5.8 | values in Newtons

Results show all compositions plated at 40 and 60 microinch thicknesses of gold have acceptable long-term reliability based on the aging the parts (1) at 150° c., aging for 1000 hrs (2) at 85% relative humidity at 85° C. at 1000 hrs and (3) thermal cycles at −40° c. to +120° c. for 1000 hrs.

What is claimed is:

1. A printed silver paste composition on a green LTCC substrate, for eliminating silver pad lift off upon electro-less nickel and gold plating onto a silver pad of a LTCC device, consisting essentially of, based on weight percent, 75-90% silver powder of different sizes and shapes appropriate for screen printing, 0.5-4% glass composition and the balance organic medium, wherein the glass composition is an alumino-borosilicate glass as "network formers" with Zn, Ba, Mg, Sr, Sn, Ti, and Na ions as "net-work modifying cations"; wherein the silver paste is printed on a green LTCC substrate at a thickness of 10 to 30 microns, so as to be capable of forming a silver pad after firing at a heating profile of 3.5 hours or greater appropriate for the LTCC substrate; wherein the green LTCC substrate is formed by casting a thin layer of a slurry dispersion of glass, ceramic filler, polymeric binder, and solvent, followed by heating in order to remove said solvent; wherein the percent weight loss due to leaching of the LTCC substrate after firing at said heating profile, as measured by dipping the fired LTCC substrate into separate 10% acid strength of HCl and $H_2SO_4$ at a constant temperature of 40° C. for a constant period of time of 30 minutes, is less than about 0.42 for HCl and less that about 0.23 for $H_2SO_4$; and wherein said glass composition comprises by weight percentage 20.2% $SiO_2$; 2.8% $Al_2O_3$; 20.4% $B_2O_3$; 10.1% ZnO; 19.0% BaO; 3.1% MgO; 3.3% $Na_2O$; 13.7% SrO; 5.5% $TiO_2$; and 1.9% $SnO_2$.

* * * * *